(12) United States Patent
Weber et al.

(10) Patent No.: US 6,301,188 B1
(45) Date of Patent: Oct. 9, 2001

(54) METHOD AND APPARATUS FOR REGISTERING FREE FLOW INFORMATION

(75) Inventors: Larren G. Weber, Caldwell; William N. Thompson; John D. Porter, both of Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/372,245

(22) Filed: Aug. 11, 1999

(51) Int. Cl.$^7$ ........................................................ G11C 8/00
(52) U.S. Cl. ............... 365/233; 365/189.05; 365/230.08; 365/194
(58) Field of Search .............................. 365/233, 189.05, 365/230.08, 194

(56) References Cited

U.S. PATENT DOCUMENTS

| | | | |
|---|---|---|---|
| 5,787,489 | 7/1998 | Pawlowski | 711/189 |
| 5,822,254 | * 10/1998 | Koshikawa et al. | 365/189.05 |
| 5,831,929 | * 11/1998 | Manning | 365/233 |
| 5,848,431 | 12/1998 | Pawlowski | 711/5 |
| 5,953,286 | * 9/1999 | Matsubara et al. | 365/233 |
| 6,052,329 | * 4/2000 | Nishino et al. | 365/233 |
| 6,084,802 | * 7/2000 | Shinozaki | 365/189.05 |

* cited by examiner

Primary Examiner—Amir Zarabian
Assistant Examiner—Tuan T. Nguyen
(74) Attorney, Agent, or Firm—Dickstein Shapiro Morin & Oshinsky LLP

(57) ABSTRACT

A synchronous circuit, such as an SRAM, includes core circuitry for processing input signals and multiple terminals for receiving, respectively, an input signal, an external clock signal and a control signal. The synchronous circuit includes a latch for receiving the input signal and an internal clock signal. The latch has an output connected to the core circuitry and can operate in a latched state and an unlatched state. The circuit also includes an internal clock controller for receiving the external clock signal and the control signal and for providing the internal clock signal to the latch to control transitions of the latch between the latched and unlatched states based on the external clock signal and the control signal. The internal clock controller extends the period of time in which the latch operates in the latched state in response to an input from the external clock, and maintains the latch in the latched state for multiple cycles of the external clock in response to assertion of the control signal.

30 Claims, 7 Drawing Sheets

METHOD AND APPARATUS FOR REGISTERING FREE FLOW INFORMATION

BACKGROUND

The present invention relates generally to integrated circuits, and more particularly, to a method and apparatus for registering free flow information in integrated circuits.

Integrated circuits, such as synchronous circuits, are widely used in computer systems because information entered into the circuit can be processed quickly and made available as valid output information. One example of a synchronous circuit is a synchronous static random access memory (SRAM) device. Such synchronous memory devices are registered and accessed based on externally generated clock signals which provide for synchronous operation of the device.

Synchronous circuits such as synchronous SRAMs typically employ one or more input registers to capture information at the input terminals and to pass the information to core circuitry. A register may be implemented, for example, as a pair of latches.

Ideally, data presented to the inputs of a synchronous circuit should be available as reliable, valid data as soon as possible. In other words, the time between the appearance of the data at the inputs to the circuit and the appearance of a correct and stable output to the core circuitry should be as small as possible.

In addition, the output data should remain reliable and valid until processing of the data performed by the core circuit is completed. The details of such internal processing depend on the particular device or system in which the input data is to be used. For example, in a synchronous SRAM circuit, information from a register may be encoded and used to access individual memory cells for a read or a write operation. In a read operation, once the individual memory cells have been accessed, the data from the cells can be passed to other circuitry. Processing of the input data sometimes requires more than one system clock cycle.

Unfortunately, neither registers nor latches exhibit such ideal behavior. For example, data presented to the input of a register is sampled, stored and propagated through the register upon the occurrence of a rising edge of the system clock. Although the register holds the data appearing at its inputs for the duration of the clock cycle, the data is not captured by the register until the rising edge of the clock signal. In addition, the transparency is subject to a delay introduced by the response time of the individual components of the register.

Similarly, a latch allows input data to be passed through to the core circuitry, and captures the data, for example, on a rising edge of a system clock signal. The captured data is held by the latch until the occurrence of a falling edge of the clock signal, at which time the previously-held data is released by the latch.

FIG. 1 is a timing diagram which illustrates some disadvantages that are occasionally associated with registers and latches used to capture and propagate input data in synchronous SRAMs and similar devices. The illustrated signals include an external clock signal, an input data signal that appears at the input to a latch or register, and data signals appearing at the output of the latch and register, respectively. Upon the occurrence of a rising edge of the external clock signal at a time 10, data appearing at the output of the latch becomes valid. However, data appearing at the output of the register does not become valid until a subsequent time 12 after the occurrence of the rising edge of the external clock signal. Therefore, a delay is introduced with respect to the availability of valid output data from the register. Upon the occurrence of a falling edge of the external clock signal at a time 14, the data at the output of the latch is no longer valid. Processing of the captured data is not completed, however, until a later time 16.

Therefore, it would be desirable to provide a technique in which input data can be captured and passed to SRAM or other core circuitry quickly and held as long as necessary until completion of processing by the core circuitry.

SUMMARY

In general, according to one aspect, a circuit, such as a synchronous SRAM, includes core circuitry for processing input signals. Multiple terminals are provided to the circuit for receiving, respectively, an input signal and an external clock signal. The circuit includes a latch for receiving the input signal and an internal clock signal. The latch has an output connected to the core circuitry and can operate in a latched state and an unlatched state. The circuit also includes an internal clock controller for receiving the external clock signal and for providing the internal clock signal to the latch to control transitions of the latch between the latched and unlatched states based on the external clock signal. In response to an external clock signal, the internal clock controller extends the period of time in which the latch operates in the latched state.

In another aspect, the circuit includes a terminal for receiving a control signal. The internal clock maintains the latch in the latched state for multiple cycles of the external clock in response to assertion of the control signal.

Various implementations of the circuit can include one or more of the following features. In general, input signals can include address, data or control signals that are to be processed or used by the core circuitry. The internal clock controller can include a delay circuit to provide a delayed version of the external clock signal. The delay circuit can include, for example, multiple inverters and can extend the period of time in which the latch operates in the latched state by a predetermined amount of time. In some implementations, the delay circuit extends the period of time in which the latch operates in the latched state by an amount of time based on the type of operation to be performed with respect to the input signal.

If the circuit is a synchronous SRAM, the SRAM core may include a memory array, an address decoder, write drivers, sense amplifiers and input/output buffers.

According to another aspect, a method of registering free flow information in a synchronous device includes receiving an input signal and an external clock signal in the device. The input signal is passed to a latch in the device, wherein the latch can operate in either a latched state or an unlatched state. The latch is caused to operate in the latched state. While in the latched state, the latch holds the input signal to make it available to core circuity in the device. An internal clock signal is provided to the latch in response to the external clock signal and causes the period of time that the latch operates in the latched state to be extended.

In another aspect, a method of registering free flow information in a synchronous device includes receiving an input signal, an external clock signal, and a control signal in the device. The input signal is passed to a latch in the device, wherein the latch can operate in either a latched state or an unlatched state. The latch is caused to operate in the latched state. While in the latched state the latch holds the input signal to make the input signal available to core circuity in the device. An internal clock signal is provided to the latch in response to the external clock signal and maintains the latch in the latched state for multiple cycles of the external clock in response to assertion of the control signal.

One or more of the following advantages are present in some implementations. The internal clock controller can ensure that the time between the appearance of signals at the inputs to the circuit and the appearance of a correct and stable output to the core circuitry is relatively small. In addition, the internal clock controller can ensure that the output data remains reliable and valid until the core circuit completes its processing of the data.

Although the internal clock controller can be particularly advantageous for use with a synchronous SRAM, the internal clock controller also can be provided as part of other devices and systems, including other synchronous or non-synchronous memory devices, microprocessors, data controllers, routers, switches and disk drives, among others.

Additional features and advantages will be readily apparent from the following detailed description, the drawings and the claims.

DETAILED DESCRIPTION

Figure 1:
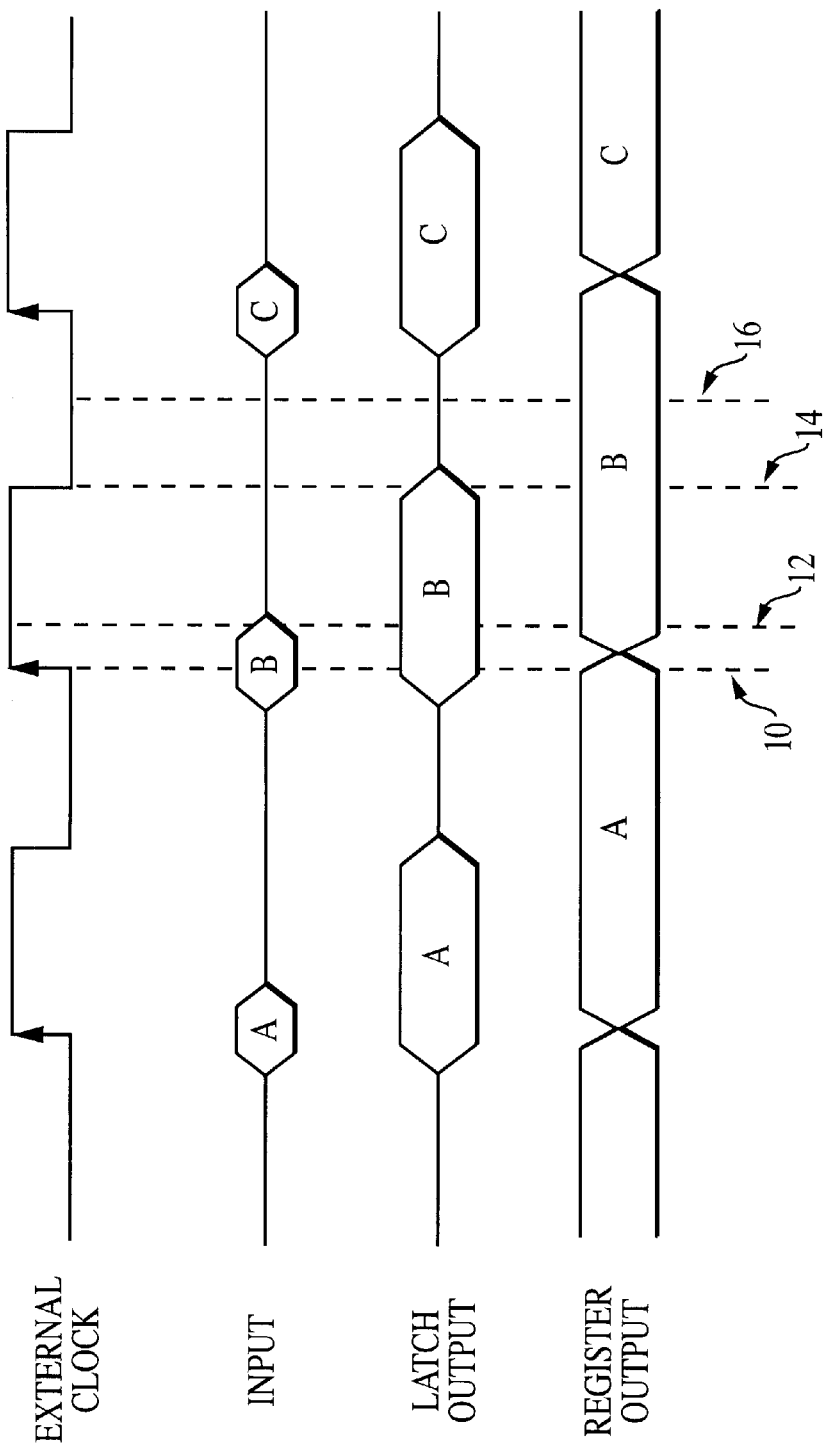
FIG. 1 is a timing diagram showing existing uses of registers and latches.
Figure 2:
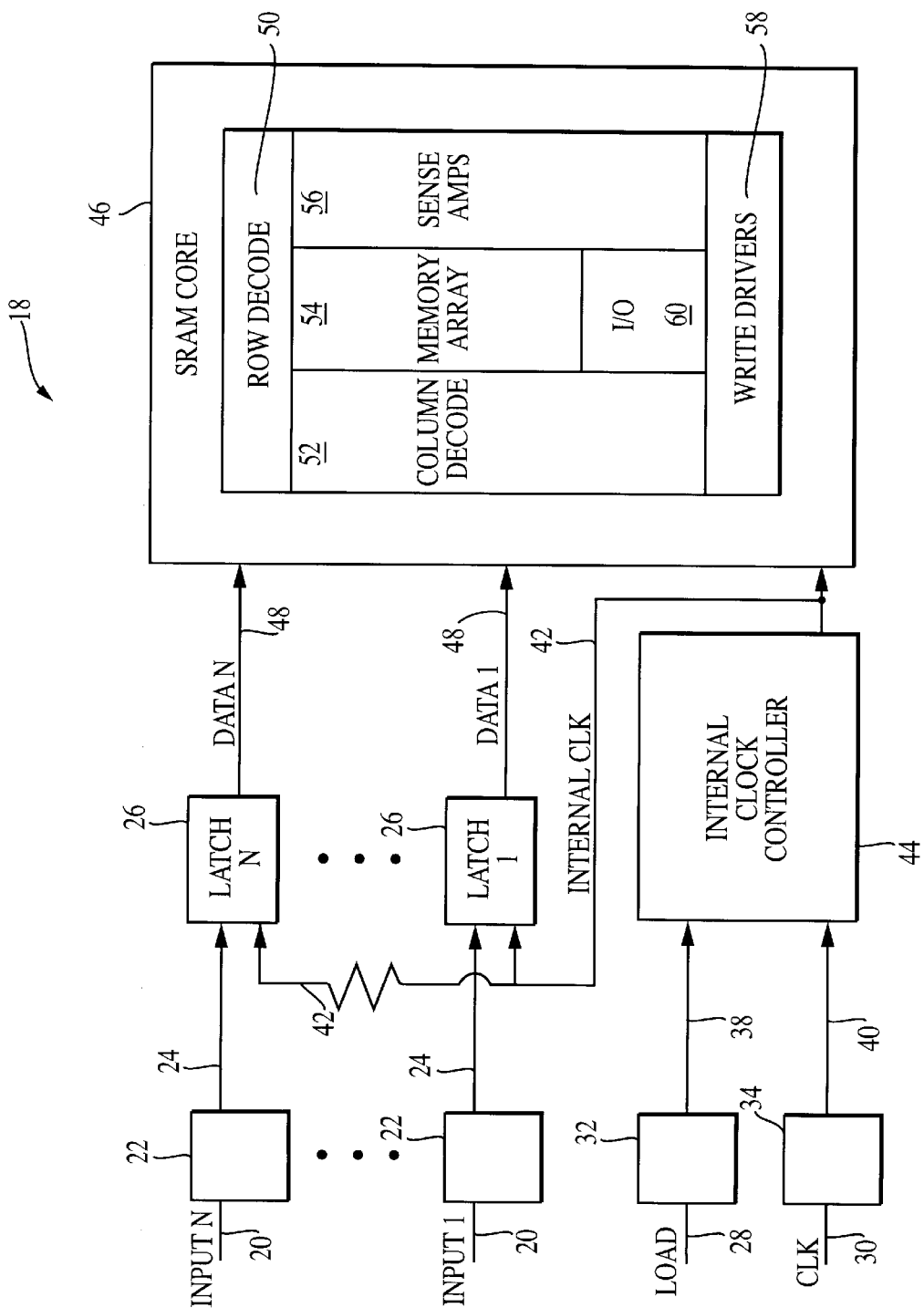
FIG. 2 is a schematic diagram of an exemplary synchronous SRAM device incorporating an internal clock controller according to the invention.

As shown in FIG. 2, an exemplary synchronous SRAM 18 includes one or more input terminals, such as pins 20, each of which is electrically connected to a corresponding input buffer 22 that propagates address, data or control signals to a corresponding latch 26 via a line 24. Other external connections to the SRAM 18 include a terminal, such as pin 28, for receiving a special control signal (LOAD) and a terminal, such as pin 30, for receiving an external clock signal. The pins 28, 30 are electrically connected to buffers 32 and 34, respectively. The external clock pin 30 carries a clock signal (CLK) that can be provided by an external clock, such as a system clock. The outputs of the buffers 32, 34 are presented to an internal clock controller 44 via lines 38, 40, respectively. Further details of an exemplary internal clock controller 44 are described below.

As discussed in greater detail below, the special control signal (LOAD) can be provided by a user to modify the output of the internal clock controller 44. The special control signal (LOAD) on pin 28 can be a single externally-provided signal. However, in other implementations, the special control signal presented to the internal clock controller 44 can be a function of multiple signals received by the SRAM.

An output of the internal clock controller 44 is electrically connected to an input of each latch 26 via line 42 to control transition of the latch between a latched state and an unlatched state. In the illustrated implementation, when the output of the internal clock controller 44 is a digital low signal, the latch 26 operates in the unlatched state. In other words, the latch is transparent and allows signals appearing on the line 24 to be passed to the SRAM core 46 via a corresponding line 48. On the other hand, when the output of the internal clock controller 44 is a digital high signal, the latch 26 operates in a latched state. In other words, the latch is closed to hold the previously-received signal at its output. When the latch 26 is closed, signals subsequently appearing on the line 24 do not pass through the latch to the SRAM core 46.

As illustrated in FIG. 2, the output of the internal clock controller 44 also can be provided to the SRAM core 46.

The SRAM core 46 can include, for example, address decoding logic elements 50, 52, memory array core elements 54, one or more write drivers 58 for temporarily holding data to be entered into the memory array 54, sense amplifiers 56, and input/output (I/O) buffers 60 to facilitate the transfer of data to and from the memory array.

Figure 3:
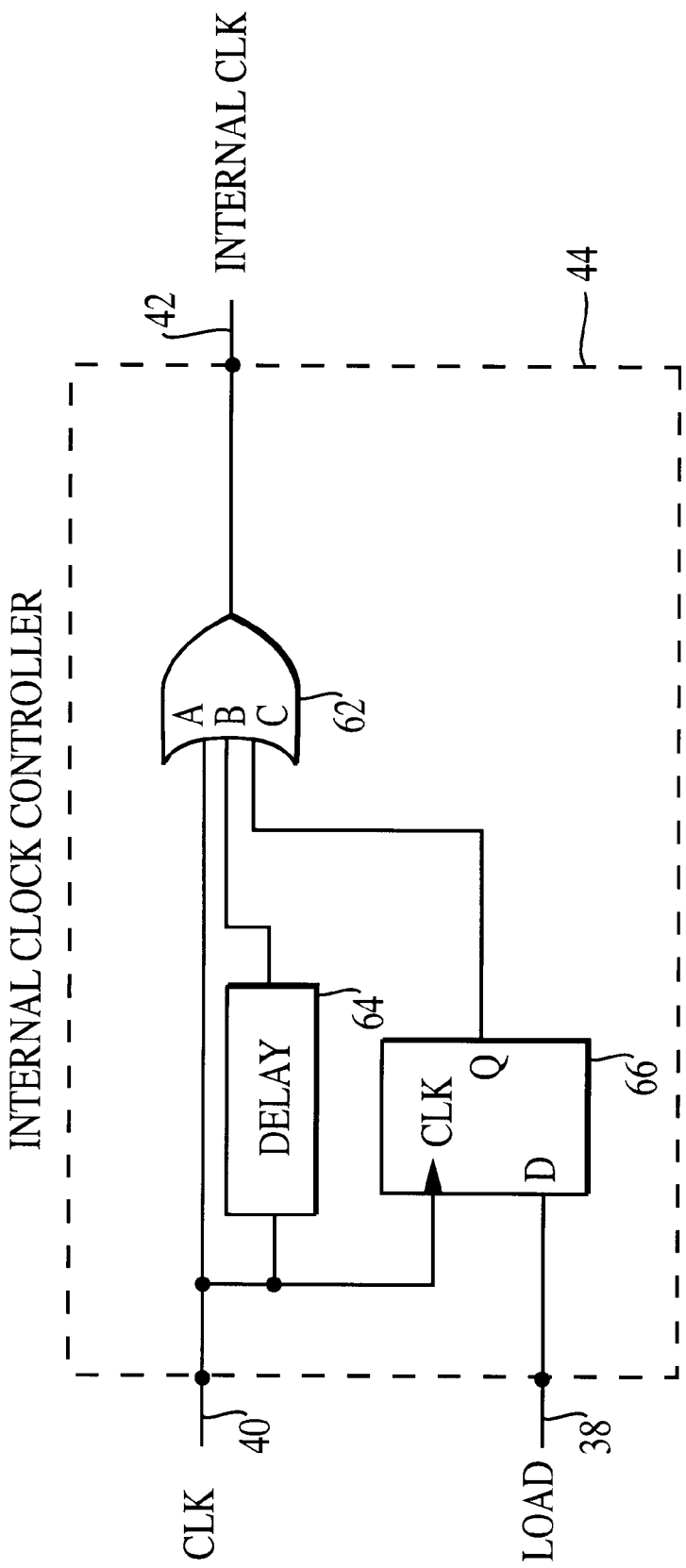
FIG. 3 illustrates further details of an exemplary internal clock controller according to one implementation of the invention.

As shown in FIG. 3, one embodiment of the internal clock controller 44 includes a three-input OR gate 62. One input (A) to the OR gate 62 is the clock signal received from the buffer 34. The clock signal from the buffer 34 also can be provided as an input to a delay circuit 64 having an output that serves as a second input (B) to the OR gate 62. In general, the delay circuit provides a delayed version of the clock signal received from the buffer 34. Thus, the external clock signal is provided to input B of the OR gate 62 a predetermined time after the external clock signal is provided to input A of the OR gate. In some implementations, the delay circuit 64 may cause a delay with respect to the external clock signal's rising edge that is different from the delay caused with respect to the falling edge of the clock signal. For example, the rising edge can be delayed by a slightly greater period of time than the falling edge. A third input (C) to the OR gate can be provided from the output of a blocking circuit which can include, for example, a counter or flip-flop. In the illustrated embodiment, a D-type flip-flop 66 receives the LOAD signal on line 38 from the buffer 32. The clock signal from the buffer 34 also serves as a clock signal for the flip-flop 66. The internal clock signal on line 42 will, therefore, be high if at least one of the signals presented to the inputs A, B, C of the OR gate 62 is high.

Figure 4:
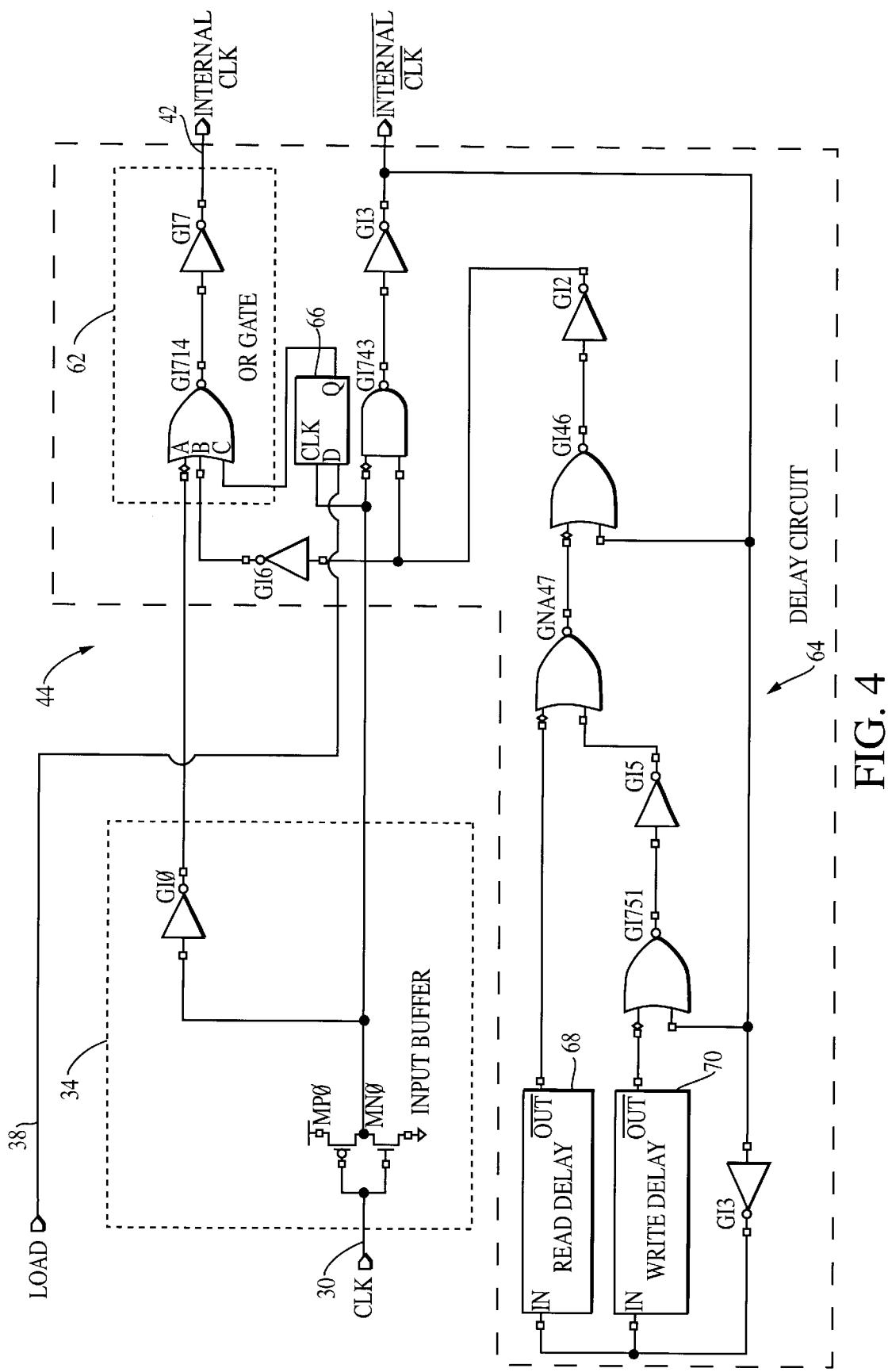
FIG. 4 illustrates additional details of circuitry associated with the internal clock controller according to an exemplary embodiment of the invention.

FIG. 4 illustrates further details of an exemplary implementation of an input buffer 34 and the internal clock controller 44. The delay circuit 64 can include a chain of one or more inverters, as well as other gates. As shown in FIG. 4, the delay circuit 64 can provide a delay whose duration depends on the type of operation to be performed with respect to the input data. For example, a read delay circuit 68 can introduce a first delay for read operations, and a write delay circuit 70 can introduce a different delay for write operations. In other implementations, a single delay is used regardless of the type of operation to be performed by the core SRAM.

Figure 5:
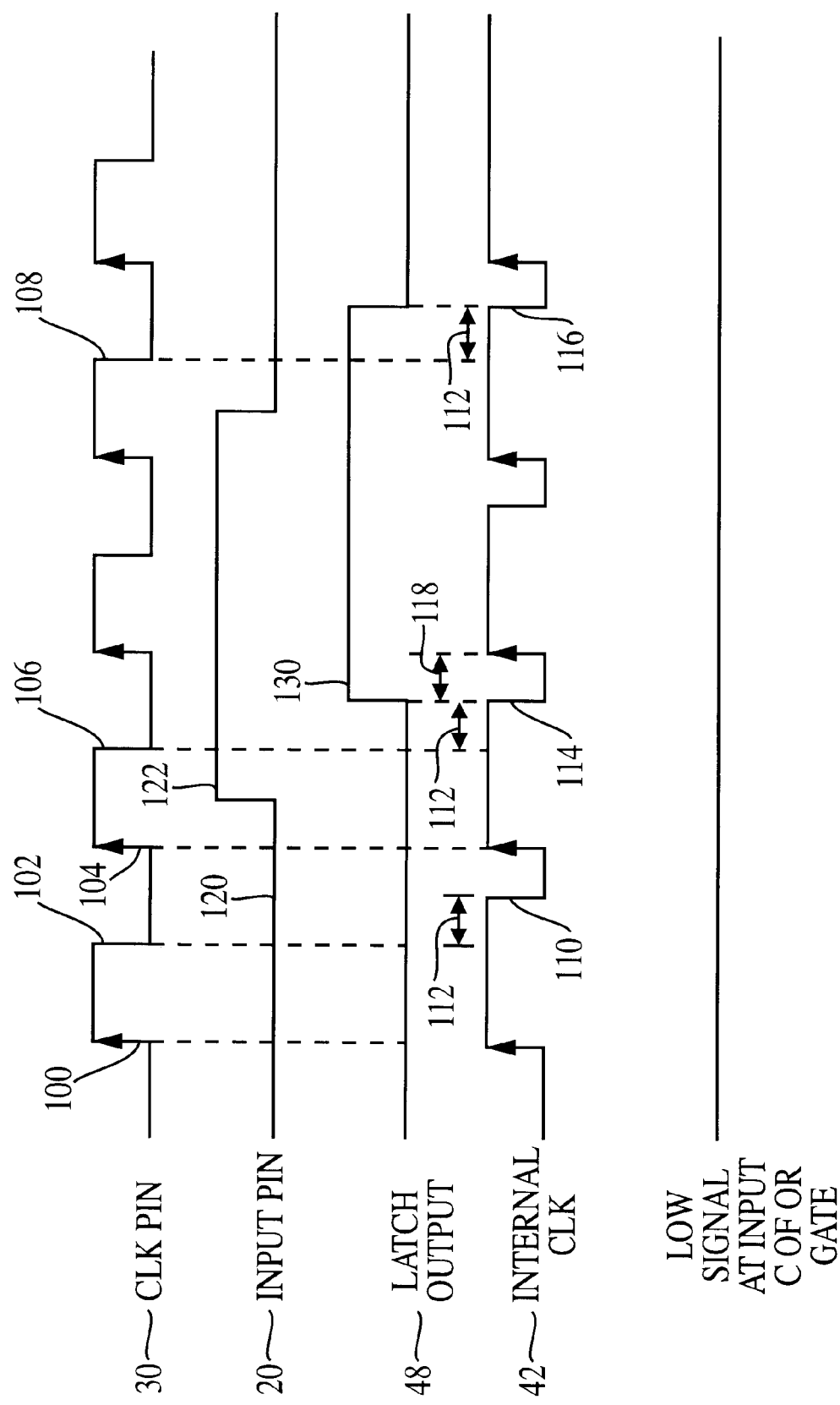
FIGS. 5–7 are timing diagrams illustrating various embodiments of the present invention.
Figure 6:
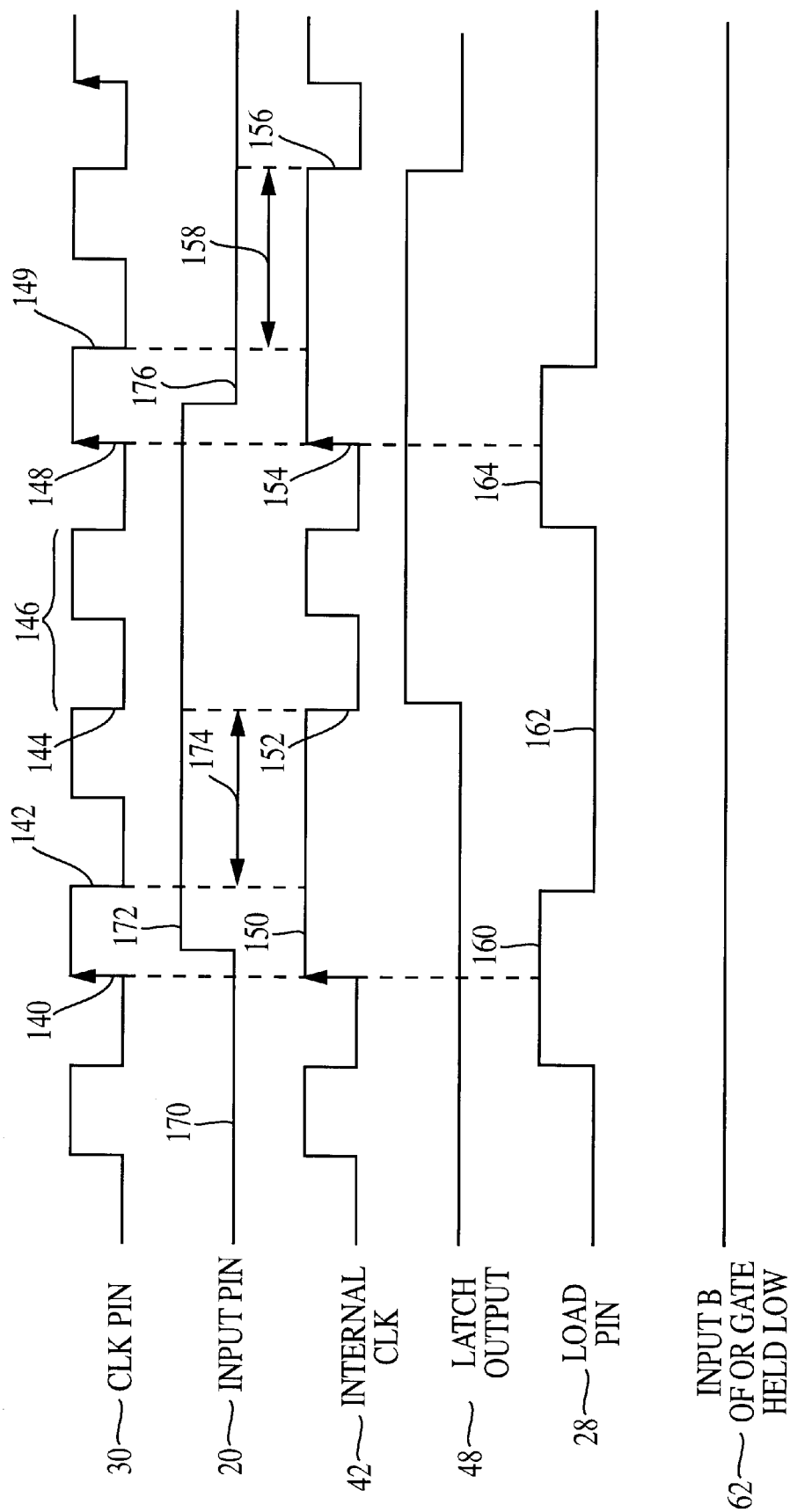
Figure 7:
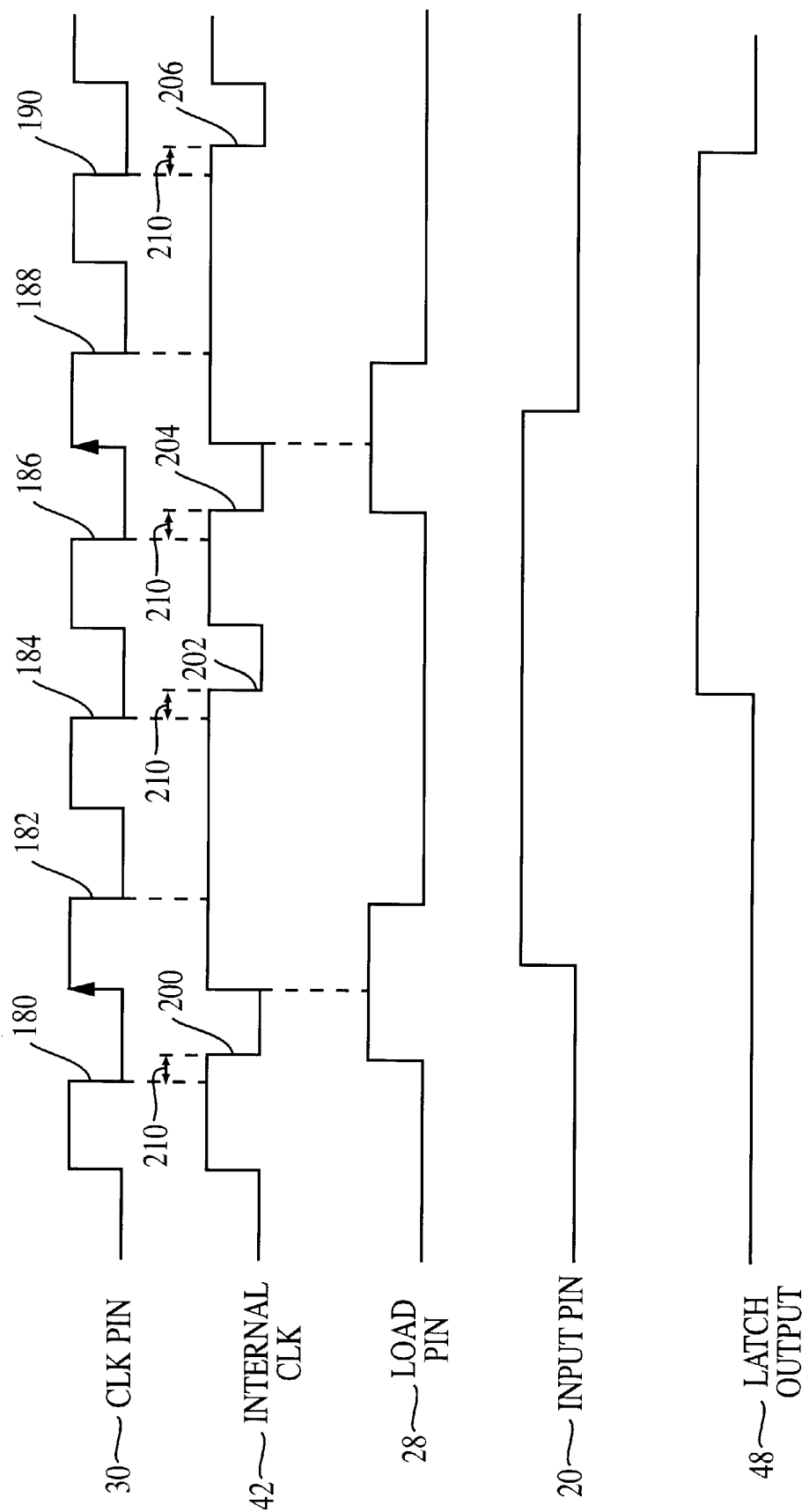

Operation of the internal clock controller 44 to control the latches 26 is now explained with respect to the timing diagrams of FIGS. 5–7. For example, the internal clock controller 44 can be used to allow data appearing at an input pin 20 to be made available to the SRAM core 46 very quickly and to extend the period of time that data provided from the latch to the SRAM core 46 is valid. FIG. 5 illustrates a signal appearing on the clock pin 30 and a signal provided to one of the input pins 20. FIG. 5 also shows a corresponding signal that appears on the internal clock output line 42, and the signal appearing at the output of the latch 26. For the purpose of facilitating understanding of the function of the delay circuit 64, it is assumed in the following discussion of FIG. 5 that input C of the OR gate is electrically connected to a constant digital low signal.

In the example of FIG. 5, when the internal clock controller 44 experiences a falling edge 110, the signal presented at the input of a latch 26 can propagate to the SRAM core 46 via line 48. The external clock signal provided to pin 30 passes through the buffer 34 to input A of the OR gate 62 and to the delay circuit 64 almost instantaneously. Therefore, a rising edge 100 appearing at the external clock pin 30 causes the output 42 of the internal clock controller 44 to go high. When a falling edge 102 subsequently appears on the external clock pin 30, the output 42 of the internal clock controller 44 remains high for an additional period of time 112. The additional period of time 112 is determined by the delay introduced by the delay circuit 64. In other words, the delay circuit 64 causes input B of the OR gate 62 to remain high even after the clock signal appearing at input A of the OR gate goes low. When the extended time period 112 expires, the output of the OR gate 62, and thus the output of the internal clock controller 44, goes low because all three inputs A, B, C of the OR gate are low. At that time, data appearing at the input of the latch 26 can pass through to the SRAM core 46.

Several advantages that can be achieved by using the internal clock controller 44 can be appreciated by considering the next system cycle in FIG. 5. As before, the output 42 of the internal clock controller 44 goes high upon the occurrence of a rising edge 104 of the external clock signal. At this time, the signals on the input pin 20 and the output 48 of the latch 26 are low. During the transition between the rising edge 104 and the falling edge 106 of the external clock pin, the signal appearing on the input pin 20 changes from a low digital signal, as indicated by 120, to a high digital signal, as indicated by 122. As previously explained, the output 42 of the internal clock controller 44 remains high for an additional period 112 after the falling edge 106 of the external clock signal at pin 30. Only upon the occurrence of the falling edge 114 of the internal clock signal does the high data signal 122 appearing at the input to the latch 26 pass to the output of the latch as indicated by 130. A similar delay 112 occurs between the falling edge 108 of the external clock signal and the falling edge 116 of the internal clock signal.

Extending the period of time that the internal clock signal remains high by the additional period 112 delays propagation of the new signal 122 to the SRAM core 46. In other words, the "hold-time," which is defined as the period during which the data is valid after the clock cycle starts (i.e., after the internal clock signal goes high), is increased. Therefore, the signal 120 previously appearing on the output 48 of the latch 26 remains valid for a longer period of time and can be used by the SRAM core 46 during the additional period 112. As a result, the SRAM core 46 is given a longer period of time during which it can process the signals compared to the cycle of the external clock.

The hold-time for the signal 120 is increased by using a smaller setup-time for the input signal 122. The "setup-time" is defined as the period from the time when the data 122 is initially present at the input to the latch 26 until the next clock cycle begins (i.e., when the internal clock signal goes high). Despite the decrease in the setup-time, the signal 122 appearing at the input pin 20 still propagates to the SRAM core 46 with minimal delay upon the occurrence of a falling edge of the internal clock signal.

One limiting factor with respect to the implementation just described is that the internal clock signal may remain low for only a relatively short duration 118. Such a short period of time may not always be sufficient to allow the data appearing at the input of the latch 26 to propagate through the latch to its output 48, particularly if the external clock cycle is relatively short.

As explained in greater detail below, the LOAD signal can be used to modify the internal clock signal to ensure that the input signal is held for a longer time. The LOAD signal also can be used to ensure that the input signal subsequently can propagate through the latch 26 for a sufficiently long time to allow the SRAM core 46 to complete its processing of the signal before the latch 26 releases the signal. Specifically, the internal clock controller can be used to hold data in the latch 26 over multiple cycles of the external clock and to present the data to the SRAM core 46 over multiple cycles of the external clock.

FIG. 6 illustrates a timing diagram showing the inter-relationships between a signal on the clock pin 30, a signal on the input terminal 20 and a signal on the load pin 28. FIG. 6 also shows a corresponding internal clock signal at the output 42 of the internal clock controller 44 and the signal appearing on the output 48 of the latch 26 associated with the input pin 20. For the purpose of facilitating understanding of the function of the LOAD signal, it is assumed in the following discussion of FIG. 6 that input B of the OR gate is electrically connected to a constant digital low signal rather than to the output of the delay circuit 64. The signal provided to the load pin 28 is used to reduce the number of falling edges of the internal clock controller 44 during multiple cycles of the external clock.

In FIG. 6, a rising edge (e.g., 140) appearing at the external clock pin 30 causes the output 42 of the internal clock controller 44 to go high, as indicated by 150. At that time, the LOAD signal at pin 28 is high, as indicated by 160. When the external clock signal subsequently exhibits a falling edge 142, the presence of the high LOAD signal 160 prevents the internal clock controller signal from going low.

During the interval of time between the rising edge 140 and the falling edge 142 of the external clock signal, the signal at the input pin 20 goes high, as indicated by 172. However, the low input signal 170 is held by the latch 26 for an additional period of time 174 because the high LOAD signal 160 prevents occurrence of a falling edge in the internal clock signal when the external clock signal exhibits its next falling edge 142. The LOAD signal, therefore, increases the hold-time of the signal 170 by an additional time 174, thereby allowing the SRAM core 46 to complete its processing of the signal 170 before the new signal 172 is propagated to the SRAM core.

In the illustrated implementation, the data appearing on the input pin 20 is held by the latch 26 for one additional cycle of the external clock when the LOAD signal is high. If a counter is used instead of the flip-flop 66, the input signal may be held by the latch 26 for one or more additional cycles of the external clock. More generally, assertion of the LOAD signal prevents the internal clock signal from going low until the end of a predetermined number of additional cycles of the external clock.

As further shown in FIG. 6, when the next falling edge 144 of the external clock signal occurs, the LOAD signal is low, as indicated by 162. As a result, the internal clock signal exhibits a falling edge 152 because all the inputs to the OR gate 62 in the internal clock controller 44 are low. The input signal 172 then can propagate through the latch 26 to the SRAM core 46.

During the next external clock cycle 146, the LOAD signal in the illustrated example is still low. Therefore, the internal clock has a cycle substantially the same as the external clock cycle.

When the external clock signal exhibits its next rising edge 148, the internal clock signal exhibits a corresponding rising edge 154. At that time, the LOAD signal again is high, as indicated by 164, and the input signal in the illustrated example goes low shortly thereafter, as indicated by 176. As a result of the presence of the high LOAD signal 164, the next falling edge 156 of the internal clock signal is delayed by one cycle of the external clock. Therefore, the high input signal 172 previously held by the latch 26 can be presented to the SRAM core 46 for an additional period of time 158 after the next falling edge 149 of the external clock signal. In other words, the LOAD signal can be used to delay occurrence of a falling edge of the internal clock signal to give the SRAM core 46 sufficient time to process the input signal.

As previously noted, if a counter is used instead of the flip-flop 66, the LOAD signal can be used to delay occurrence of the falling edge of the internal clock signal by one or more cycles of the external clock.

FIG. 7 illustrates a timing diagram combining the use of the delay circuit 64 and the LOAD signal. In general, upon the occurrence of a rising edge of the external clock signal, the internal clock signal also becomes high. As previously illustrated in FIG. 5, use of the delay circuit 64 causes the internal clock signal to remain high beyond the falling edge of the external clock pin for at least a predetermined time. For example, upon the occurrence of falling edges 180, 184, 186 and 190 in the external clock signal, corresponding falling edges 200, 202, 204 and 206 in the internal clock signal on line 42 are delayed by a time 210. In addition, as previously illustrated in FIG. 6, the presence of a LOAD signal during a rising edge of the internal clock signal prevents the internal clock controller from experiencing a falling edge for one or more additional cycles of the external clock. For example, upon the occurrence of the falling edge 182 of the external clock signal, the internal clock signal does not exhibit its next falling edge 202 until the passage of an additional cycle of the external clock. Similarly, upon the occurrence of the falling edge 188 of the external clock signal, the internal clock signal does not exhibit its next falling edge 206 until the passage of an additional cycle of the external clock.

The various advantages previously discussed in connection with the timing diagrams of FIGS. 5 and 6 can be obtained by using both the delay circuit 64 and the LOAD signal to modify the internal clock signal with respect to the external clock signal.

In the particular implementations and examples discussed above, reference has been made to rising and falling edges of various signals. In general, the polarity of the signals can be reversed as long as such changes are made consistently throughout the circuit.

Other implementations are within the scope of the claims.

What is claimed is:

1. A synchronous circuit comprising:
   core circuitry for processing input signals;
   a plurality of terminals for receiving, respectively, an input signal and an external clock signal;
   a latch for receiving the input signal and an internal clock signal, wherein the latch has an output connected to the core circuitry and wherein the latch can operate in a latched state and an unlatched state; and
   an internal clock controller for receiving the external clock signal and providing the internal clock signal to the latch to control transitions of the latch between the latched and unlatched states;
   wherein the internal clock controller extends a period of time in which the latch operates in the latched state in response to the external clock signal.

2. The synchronous circuit of claim 1 wherein the internal clock controller includes a delay circuit to provide a delayed version of the external clock signal.

3. The synchronous circuit of claim 2 wherein the delay circuit includes a plurality of inverters.

4. The synchronous circuit of claim 2 wherein the delay circuit extends the period of time in which the latch operates in the latched state by a predetermined amount of time.

5. The synchronous circuit of claim 2 wherein the delay circuit extends the period of time in which the latch operates in the latched state by an amount of time based on a type of operation to be performed with respect to the input signal.

6. The synchronous circuit of claim 2, wherein a first buffer is connected between the terminal that receives the input signal,and an input of the latch, and wherein a second buffer is connected between the terminal that receives the external clock terminal and internal clock controller.

7. A synchronous circuit comprising:
   core circuitry for processing input signals;
   a plurality of terminals for receiving, respectively, an input signal, an external clock signal and a control signal;
   a latch for receiving the input signal and an internal clock signal, wherein the latch has an output connected to the core circuitry and wherein the latch can operate in a latched state and an unlatched state; and
   an internal clock controller for receiving the external clock signal and the control signal and for providing the internal clock signal to the latch to control transitions of the latch between the latched and unlatched states based on the external clock signal and the control signal;
   wherein the internal clock controller maintains the latch in the latched state for multiple cycles of the external clock in response to assertion of the control signal.

8. The synchronous circuit of claim 7 wherein the internal clock controller extends the latched state of the latch by one additional cycle of the external clock in response to assertion of the control signal.

9. The synchronous circuit of claim 7 wherein the internal clock controller includes a blocking circuit that receives the control signal as its input.

10. The synchronous circuit of claim 7, wherein a first buffer is connected between the terminal that receives the input signal and an input of the latch, a second buffer is connected between the terminal that receives the external clock terminal and the internal clock controller, and a third buffer is connected between the terminal that receives the control signal and the internal clock controller.

11. A synchronous circuit comprising:
    core circuitry for processing input signals;
    a plurality of terminals for receiving, respectively, an input signal, an external clock signal and a control signal;
    a latch for receiving the input signal and an internal clock signal, wherein the latch has an output connected to the core circuitry and wherein the latch can operate in a latched state and an unlatched state; and
    an internal clock controller for receiving the external clock signal and the control signal and for providing the internal clock signal to the latch to control transitions of the latch between the latched and unlatched states based on the external clock signal and the control signal;

wherein the internal clock controller extends a period of time in which the latch operates in the latched state in response to the external clock signal, and maintains the latch in the latched state for multiple cycles of the external clock in response to assertion of the control signal.

12. The synchronous circuit of claim 11 wherein the internal clock controller provides a delayed version of the external clock signal to extend the period of time in which the latch operates in the latched state by a predetermined amount of time.

13. The synchronous circuit of claim 11 wherein the internal clock controller extends the latched state of the latch by one additional cycle of the external clock in response to assertion of the control signal.

14. A synchronous SRAM device comprising:

an SRAM core including a memory array, an address decoder, write drivers, sense amplifiers and input/output buffers;

a plurality of terminals for receiving, respectively, an input signal and an external clock signal;

a latch for receiving the input signal and an internal clock signal, wherein the latch has an output connected to the SRAM core and wherein the latch can operate in a latched state and an unlatched state; and an internal clock controller for receiving the external clock signal and providing the internal clock signal to the latch to control transitions of the latch between the latched and unlatched states;

wherein the internal clock controller extends a period of time in which the latch operates in the latched state in response to an input from the external clock.

15. The synchronous SRAM device of claim 14 wherein the internal clock controller includes a delay circuit to provide a delayed version of the external clock signal.

16. The synchronous SRAM device of claim 15 wherein the delay circuit includes a plurality of inverters.

17. The synchronous SRAM device of claim 15 wherein the delay circuit extends the period of time in which the latch operates in the latched state by a predetermined amount of time.

18. The synchronous SRAM device of claim 15 wherein the delay circuit extends the period of time in which the latch operates in the latched state by an amount of time based on a type of operation to be performed with respect to the input signal.

19. The synchronous SRAM device of claim 15, wherein a first buffer is connected between the terminal that receives the input signal and an input of the latch, and wherein a second buffer is connected between the terminal that receives the external clock terminal and internal clock controller.

20. A synchronous SRAM device comprising:

an SRAM core including a memory array, an address decoder, write drivers, sense amplifiers and input/output buffers;

a plurality of terminals for receiving, respectively, an input signal, an external clock signal and a control signal;

a latch for receiving the input signal and an internal clock signal, wherein the latch has an output connected to the SRAM core and wherein the latch can operate in a latched state and an unlatched state; and an internal clock controller for receiving the external clock signal and the control signal and for providing the internal clock signal to the latch to control transitions of the latch between the latched and unlatched states based on the external clock signal and the control signal;

wherein the internal clock controller maintains the latch in the latched state for multiple cycles of the external clock in response to assertion of the control signal.

21. The synchronous SRAM device of claim 20 wherein the internal clock controller extends the latched state of the latch by one additional cycle of the external clock in response to assertion of the control signal.

22. A synchronous SRAM comprising:

an SRAM core including a memory array, an address decoder, write drivers, sense amplifiers and input/output buffers;

a plurality of terminals for receiving, respectively, an input signal, an external clock signal and a control signal;

a latch for receiving the input signal and an internal clock signal, wherein the latch has an output connected to the SRAM core and wherein the latch can operate in a latched state and an unlatched state; and an internal clock controller for receiving the external clock signal and the control signal and for providing the internal clock signal to the latch to control transitions of the latch between the latched and unlatched states based on the external clock signal and the control signal;

wherein the internal clock controller extends a period of time in which the latch operates in the latched state in response to an input from the external clock, and to maintain the latch in the latched state for multiple cycles of the external clock in response to assertion of the control signal.

23. The synchronous SRAM device of claim 22 wherein the internal clock controller provides a delayed version of the external clock signal to extend the period of time in which the latch operates in the latched state by a predetermined amount of time.

24. The synchronous SRAM device of claim 23 wherein the internal clock controller extends the latched state of the latch by one additional cycle of the external clock in response to assertion of the control signal.

25. A method of registering free flow information in a synchronous device, the method including:

receiving an input signal and an external clock signal in the device;

passing the input signal to a latch in the device, wherein the latch can operate in either a latched state or an unlatched state;

causing the latch to operate in the latched state, wherein while in the latched state, the latch holds the input signal to make the input signal available to core circuity in the device; and providing an internal clock signal to the latch in response to the external clock signal, wherein the internal clock signal causes the period of time that the latch operates in the latched state to be extended.

26. The method of claim 25 wherein the act of providing an internal clock signal to the latch includes using a delayed version of the external clock signal.

27. The method of claim 25 wherein the period of time that the latch operates in the latched state is extended by a predetermined amount of time.

28. The method of claim 25 the period of time in which the latch operates in the latched state is extended by an amount of time based on a type of operation to be performed with respect to the input signal.

29. A method of registering free flow information in a synchronous device, the method including:

receiving an input signal, an external clock signal, and a control signal in the device;

passing the input signal to a latch in the device, wherein the latch can operate in either a latched state or an unlatched state;

causing the latch to operate in the latched state, wherein while in the latched state the latch holds the input signal to make the input signal available to core circuity in the device;

providing an internal clock signal to the latch in response to the external clock signal, wherein the internal clock signal maintains the latch in the latched state for multiple cycles of the external clock in response to assertion of the control signal.

30. The method of claim 29 wherein the internal clock signals extends the latched state of the latch by single additional cycle of the external clock in response to assertion of the control signal.

\* \* \* \* \*